(12) United States Patent
Kim et al.

(10) Patent No.: US 12,387,672 B2
(45) Date of Patent: Aug. 12, 2025

(54) TRANSPARENT DISPLAY DEVICE

(71) Applicant: LG Display Co., Ltd., Seoul (KR)

(72) Inventors: EuiTae Kim, Paju-si (KR); ChangSoo Kim, Paju-si (KR); Soyi Lee, Paju-si (KR); DongHo Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 704 days.

(21) Appl. No.: 17/487,555

(22) Filed: Sep. 28, 2021

(65) Prior Publication Data

US 2022/0149139 A1 May 12, 2022

(30) Foreign Application Priority Data

Nov. 11, 2020 (KR) .......................... 10-2020-0150409

(51) Int. Cl.
*G09G 3/3225* (2016.01)
*G09G 3/3233* (2016.01)
(Continued)

(52) U.S. Cl.
CPC ......... *G09G 3/3233* (2013.01); *G09G 3/3225* (2013.01); *H10K 50/814* (2023.02); *H10K 59/122* (2023.02); *H10K 59/124* (2023.02); *G09G 2300/0426* (2013.01); *G09G 2310/0232* (2013.01); *G09G 2310/0281* (2013.01); *H10K 59/131* (2023.02); *H10K 59/80516* (2023.02)

(58) Field of Classification Search
CPC ......... G09G 3/3233; G09G 2300/0426; G09G 3/3258; G09G 3/20; G09G 2300/0439; G09G 2310/0232; G09G 3/3225; G09G 2330/021; H10K 59/131; H10K 59/1213; H10K 59/122; H10K 59/124; H10K 59/123; H10K 59/80516
See application file for complete search history.

(56) References Cited

U.S. PATENT DOCUMENTS

| | | | |
|---|---|---|---|
| 9,691,330 B2 | 6/2017 | Lee et al. | |
| 2014/0176399 A1* | 6/2014 | Lee | G09G 3/20 345/55 |

(Continued)

FOREIGN PATENT DOCUMENTS

| | | | |
|---|---|---|---|
| KR | 10-2015-0080198 A | 7/2015 | |
| KR | 20160022969 A | 3/2016 | |

(Continued)

*Primary Examiner* — Dismery Mercedes
(74) *Attorney, Agent, or Firm* — Seed Intellectual Property Law Group LLP

(57) ABSTRACT

A transparent display device may improve light transmittance. The transparent display device comprises a substrate provided with a display area on which a plurality of subpixels are disposed, a first non-display area disposed at a first side of the display area and a second non-display area disposed at a second side facing the first side, a first common power electrode extended from the first non-display area in a first direction, a second common power electrode extended from the second non-display area in the first direction, and an initialization line extended from the display area in a second direction, electrically connecting the first common power electrode with the second common power electrode and supplying an initialization voltage to each of the plurality of subpixels.

22 Claims, 12 Drawing Sheets

(51) Int. Cl.
    *H10K 50/814*     (2023.01)
    *H10K 59/122*     (2023.01)
    *H10K 59/124*     (2023.01)
    *H10K 59/131*     (2023.01)
    *H10K 59/80*     (2023.01)

(56) References Cited

U.S. PATENT DOCUMENTS

| | | | | |
|---|---|---|---|---|
| 2014/0353671 | A1* | 12/2014 | Choi | H10K 59/131 |
| | | | | 257/72 |
| 2019/0165079 | A1* | 5/2019 | Cho | H10K 59/131 |
| 2020/0185484 | A1* | 6/2020 | Cho | H10K 59/131 |
| 2020/0212161 | A1* | 7/2020 | Choi | H10K 59/124 |
| 2020/0303421 | A1* | 9/2020 | Cho | H01L 29/7869 |
| 2020/0335025 | A1* | 10/2020 | Kim | G09G 3/20 |
| 2021/0005139 | A1* | 1/2021 | Ueno | G09G 3/3291 |
| 2021/0183983 | A1* | 6/2021 | Bang | H10K 59/121 |
| 2021/0184169 | A1* | 6/2021 | Seo | H10K 50/813 |
| 2021/0202628 | A1 | 7/2021 | Kim et al. | |
| 2021/0328002 | A1* | 10/2021 | Lee | G09G 3/3233 |
| 2022/0059637 | A1* | 2/2022 | Choi | G09G 3/3233 |
| 2022/0069165 | A1* | 3/2022 | Shin | H01L 33/382 |

FOREIGN PATENT DOCUMENTS

| | | | |
|---|---|---|---|
| KR | 10-1958744 | B1 | 3/2019 |
| KR | 20200028567 | A | 3/2020 |
| KR | 20200072928 | A | 6/2020 |

\* cited by examiner

TRANSPARENT DISPLAY DEVICE

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recently, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area.

BRIEF SUMMARY

The inventors of the present disclosure have appreciated that the transparent display device has a limitation in enhancing light transmittance as a plurality of signal lines are disposed in the non-transmissive area. The present disclosure has been made in view of the above problems, and one or more embodiments of the present disclosure provide a transparent display device that may improve light transmittance.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a transparent display device comprising a substrate provided with a display area on which a plurality of subpixels are disposed, a first non-display area disposed at a first side of the display area and a second non-display area disposed at a second side facing the first side, a first common power electrode extended from the first non-display area in a first direction, a second common power electrode extended from the second non-display area in the first direction, and an initialization line extended from the display area in a second direction, electrically connecting the first common power electrode with the second common power electrode and supplying an initialization voltage to each of the plurality of subpixels.

In accordance with another aspect of the present disclosure, the above and other technical benefits can be accomplished by the provision of a transparent display device comprising a substrate provided with a transmissive area and a non-transmissive area on which a plurality of subpixels are disposed, a first signal line disposed in the non-transmissive area, receiving an initialization voltage applied at an initialization period and receiving a first power voltage applied at an emission period, a second signal line disposed in the non-transmissive area, receiving a reference voltage applied at the initialization period, and a third signal line disposed to be spaced apart from the first signal line with the transmissive area interposed therebetween, receiving a second power voltage applied at the emission period. The first signal line and the third signal line are provided over a first layer, and the second signal line is provided over a second layer different from the first layer.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
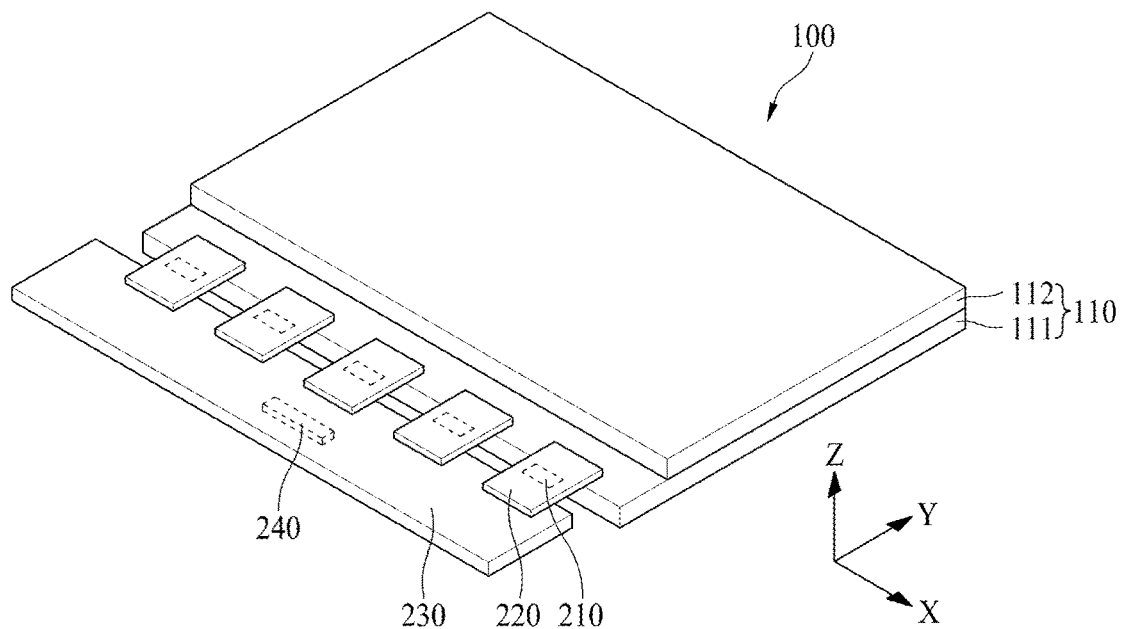
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X-axis indicates a line parallel with a scan line, Y-axis indicates a line parallel with a data line, and Z-axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device, a plasma display panel (PDP), a Quantum dot Light Emitting Display (QLED), or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The scan driver may be provided in one side of the display area of the transparent display panel 110, or the non-display area of both peripheral sides of the transparent display panel 110 by a gate driver in panel (GIP) method. In another way, the scan driver may be manufactured in a driving chip, may be mounted on the flexible film, and may be attached to one peripheral side or both peripheral sides of the display area of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be provided in the pad area PA of the transparent display panel 110. Lines connecting the pads with the source drive IC 210 and lines connecting the pads with lines of the circuit board 230 may be provided in the flexible film 220. The flexible film 220 may be attached onto the pads using an anisotropic conducting film, whereby the pads may be connected with the lines of the flexible film 220.

Figure 2:
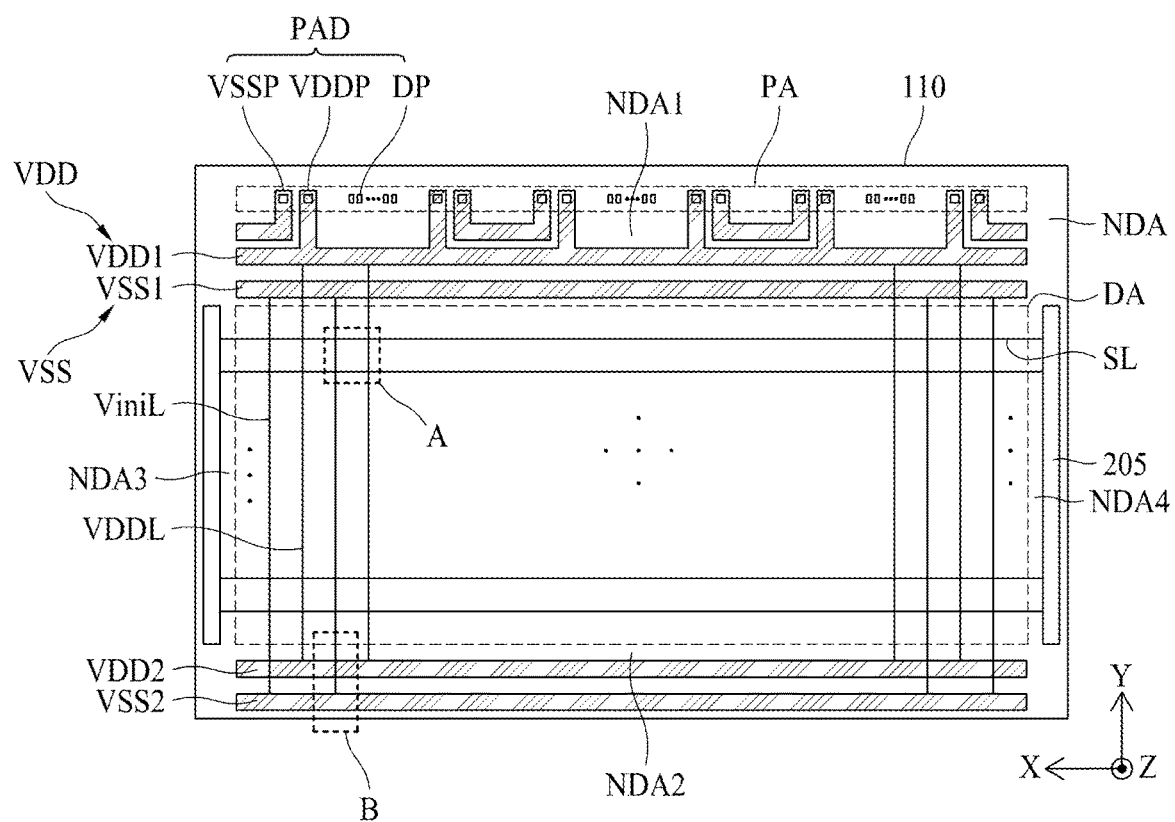
FIG. 2 is a schematic plane view illustrating a transparent display panel according to one embodiment of the present disclosure.
Figure 3:
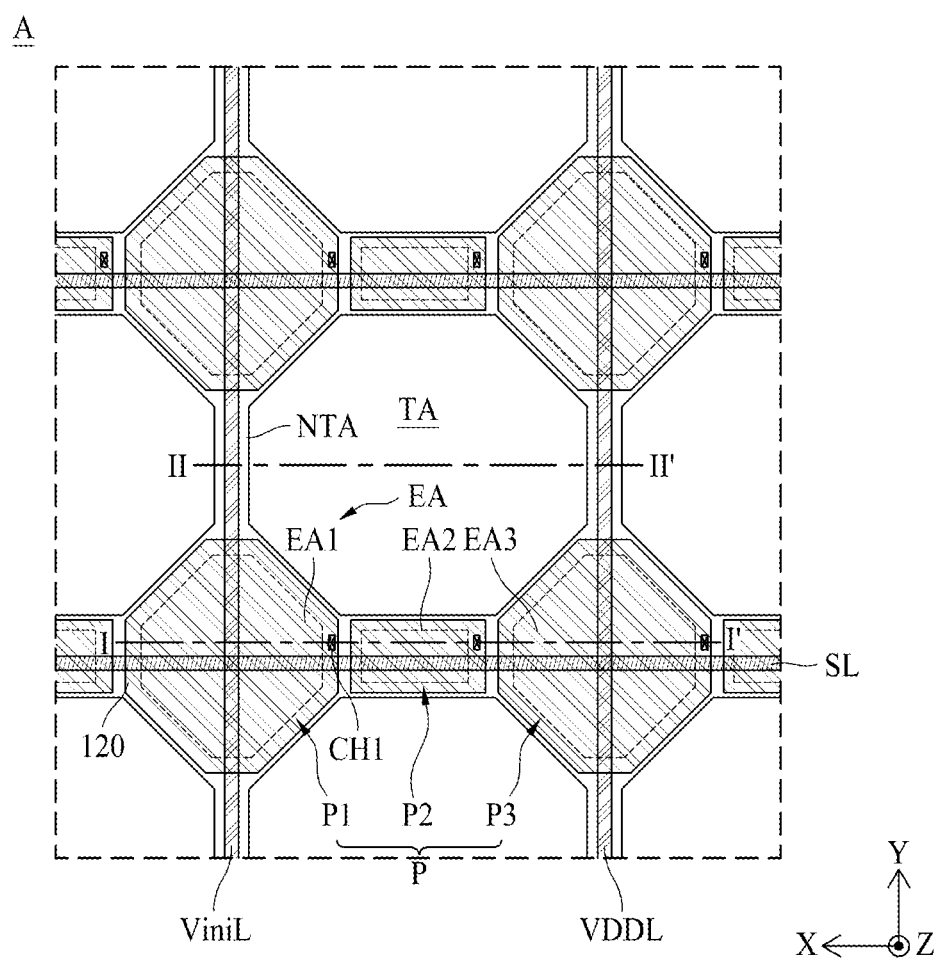
FIG. 3 is an enlarged view illustrating an area A of FIG. 2.

FIG. 2 is a schematic plane view illustrating a transparent display panel according to one embodiment of the present disclosure, and FIG. 3 is an enlarged view illustrating an area A of FIG. 2.

Referring to FIG. 2 and FIG. 3, a transparent display panel 110 may include into a display area DA provided with pixels P to display an image, and a non-display area NDA for not displaying an image.

The display area DA includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α %, for example, about 90%, and the non-transmissive area NTA may be an area where light transmittance is smaller than (3%, for example, about 50%. At this time, α is greater than β. A user may view an object or background arranged over a rear surface of the transparent display panel 110 due to the transmissive area TA.

A non-transmissive area NTA may be provided with a plurality of pixels P and a plurality of first signal lines for supplying a signal to each of the plurality of pixels P. The plurality of signal lines may be provided with pixel power lines VDDL, initialization lines ViniL, reference lines, data lines, and scan lines SL.

The scan lines SL may be extended in a first direction (e.g., X-axis direction), and may cross the pixel power lines VDDL, the initialization lines ViniL, the reference lines and the data lines in a display area DA.

The pixel power lines VDDL, the initialization lines ViniL, the reference lines and the data lines may be extended from the display area DA in a second direction (e.g., Y-axis direction). At this time, the pixel power lines VDDL and the initialization lines ViniL may alternately be disposed in the display area DA. A transmissive area TA may be disposed between the pixel power lines VDDL and the initialization lines ViniL.

The pixels P display an image by emitting predetermined or selected light. The emission area EA may correspond to an area where light is emitted from the pixel P.

Each of the pixels P may include a first subpixel P1, a second subpixel P2 and third subpixel P3. The first subpixel P1 may include a first emission area EA1 emitting light of a green color. The second subpixel P2 may include a second emission area EA2 emitting light of a red color. The third subpixel P3 may include a third emission area EA3 emitting light of a blue color. However, the emission areas are not limited to this example. Each of the pixels P may further include a fourth subpixel emitting light of a white color. Also, the arrangement order of the subpixels P1, P2 and P3 may be changed in various ways.

Hereinafter, for convenience of description, the description will be given based on that a first subpixel P1 is a green subpixel emitting green light, a second subpixel P2 is a red subpixel emitting red light, and a third subpixel P3 is a blue subpixel emitting blue light.

Each of the first subpixel P1 and the third subpixel P3 may be disposed to overlap any one of a first overlapping area where the initialization line ViniL and the scan line SL cross each other, and a second overlapping area where the pixel power line VDDL and the scan line SL cross each other.

For example, as shown in FIG. 3, at least a part of the first subpixel P1 may be disposed to overlap the first overlapping area where the initialization line ViniL and the scan line SL cross each other, and at least a part of the third subpixel P3 may be disposed to overlap the second overlapping area where the pixel power line VDDL and the scan line SL cross each other. However, the present disclosure is not limited to this example. At least a part of the first subpixel P1 may be disposed to overlap the second overlapping area, and at least a part of the third subpixel P3 may be disposed to overlap the first overlapping area. Also, the first subpixel P1 and the third subpixel P3 may alternately be disposed along an initialization line ViniL or the pixel power line VDDL.

The second subpixel P2 may be disposed between the first overlapping area and the second overlapping area. For example, the second subpixel P2 may be disposed between the first subpixel P1 and the third subpixel P3. At this time, at least a part of the second subpixel P2 may overlap the scan line SL.

For example, each of the subpixels P1, P2 and P3 may be embodied based on ten transistors.

Hereinafter, the description will be given based on that each of the pixels P1, P2 and P3 includes, but is not limited to, a 10T1C pixel circuit with reference to FIGS. 4 to 8. Various pixel circuits for providing an initialization voltage to a driving transistor DT and/or a light emitting diode may be applied to the subpixels P1, P2 and P3 according to one embodiment of the present disclosure.

Figure 4:
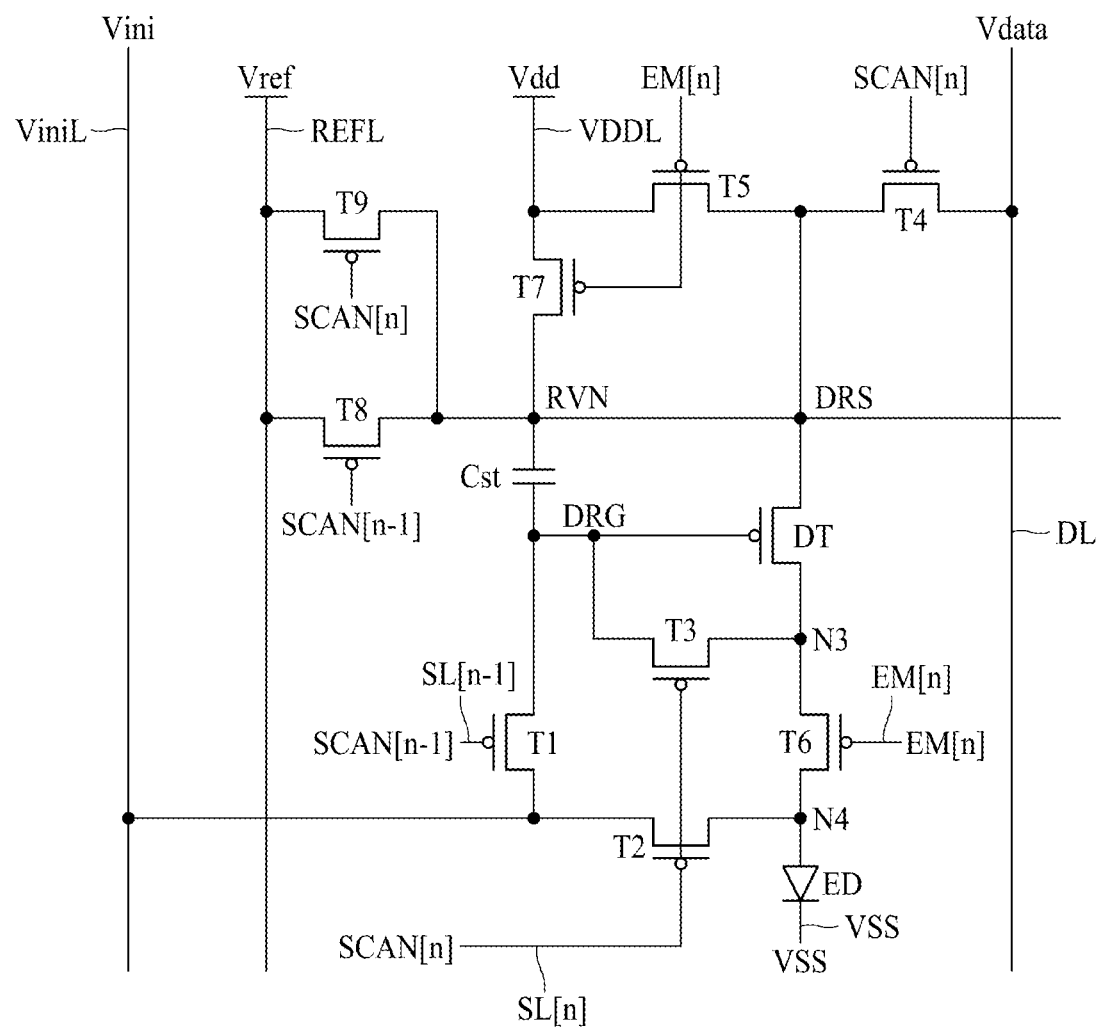
FIG. 4 is a circuit view illustrating an example of a pixel circuit.
Figure 5:
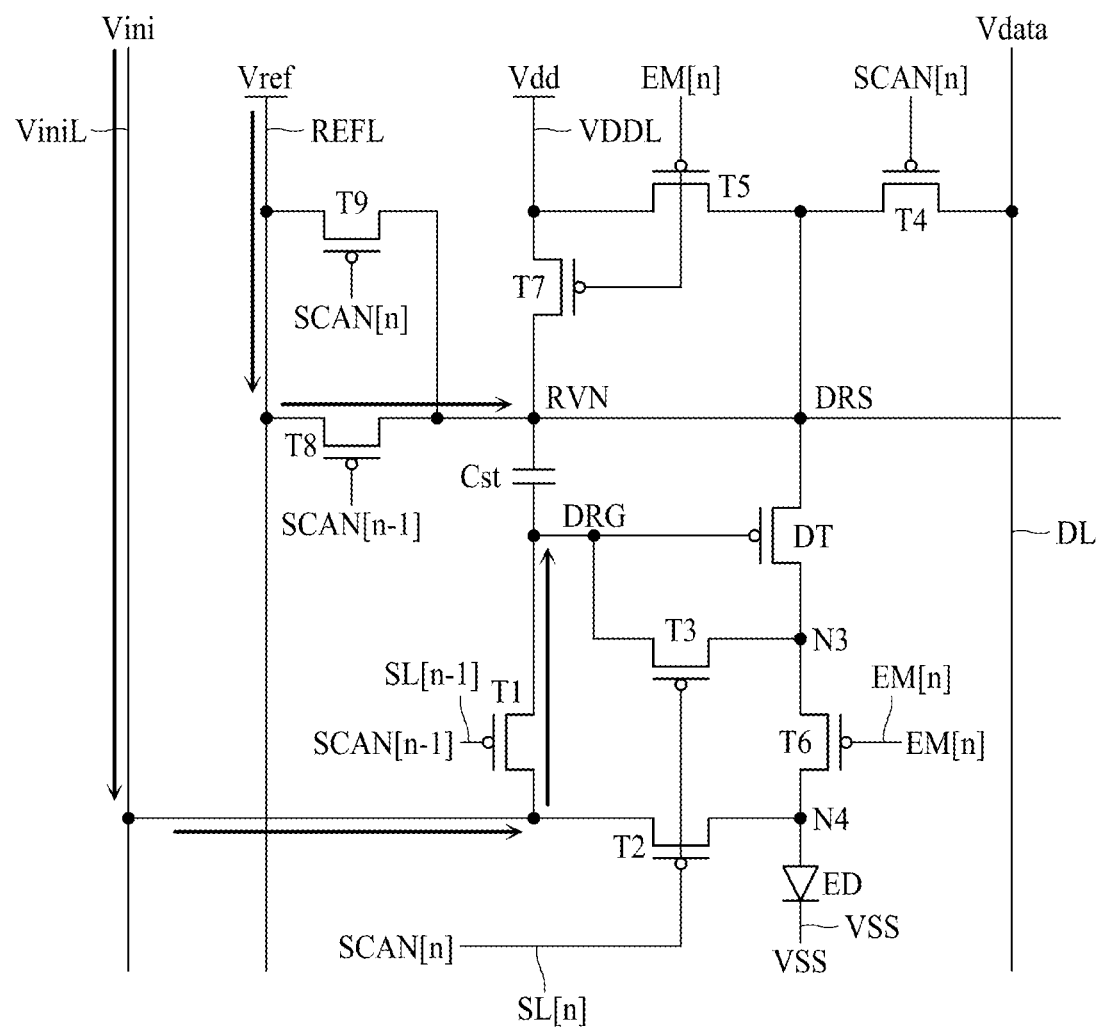
FIG. 5 is a view illustrating a signal flow at an initialization period.
Figure 6:
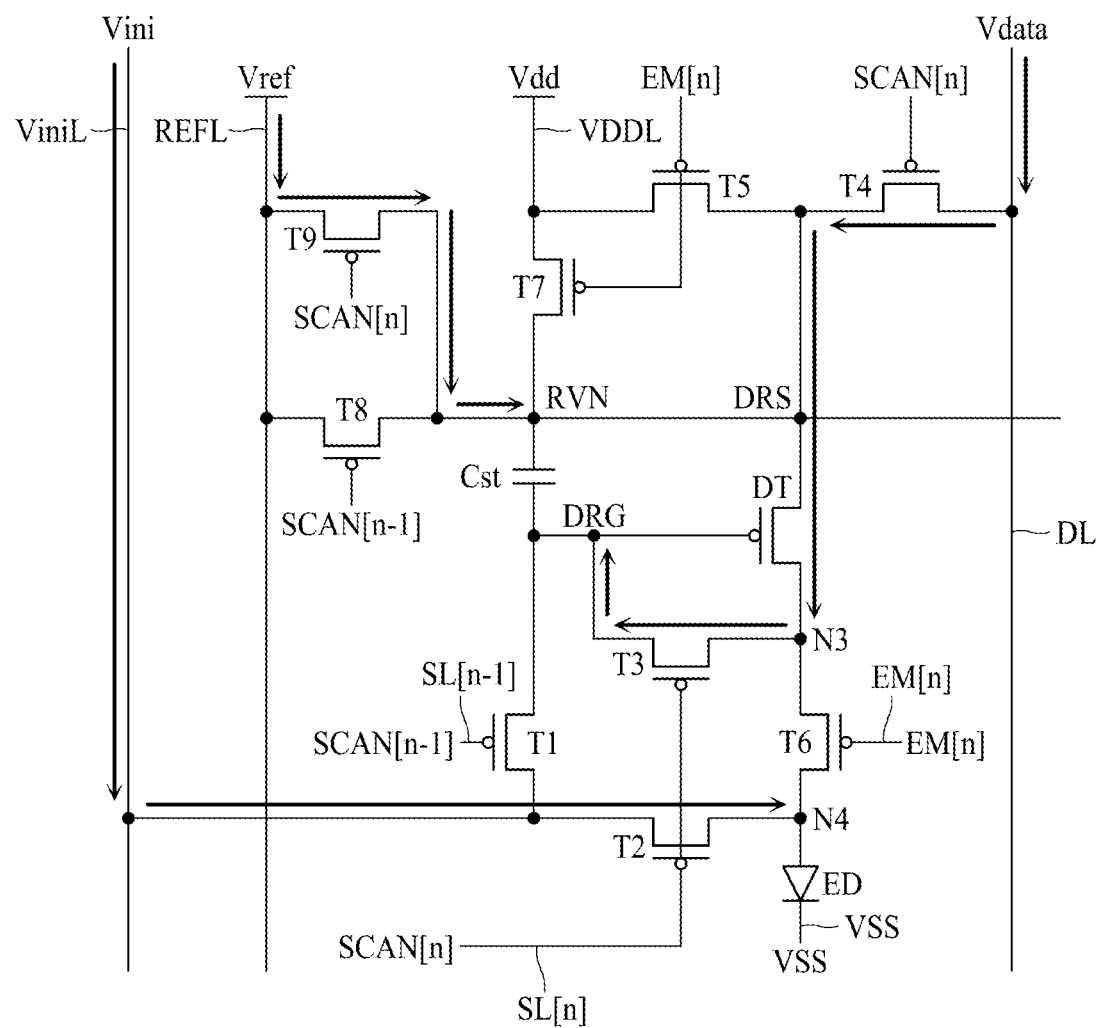
FIG. 6 is a view illustrating a signal flow at a sensing period.
Figure 7:
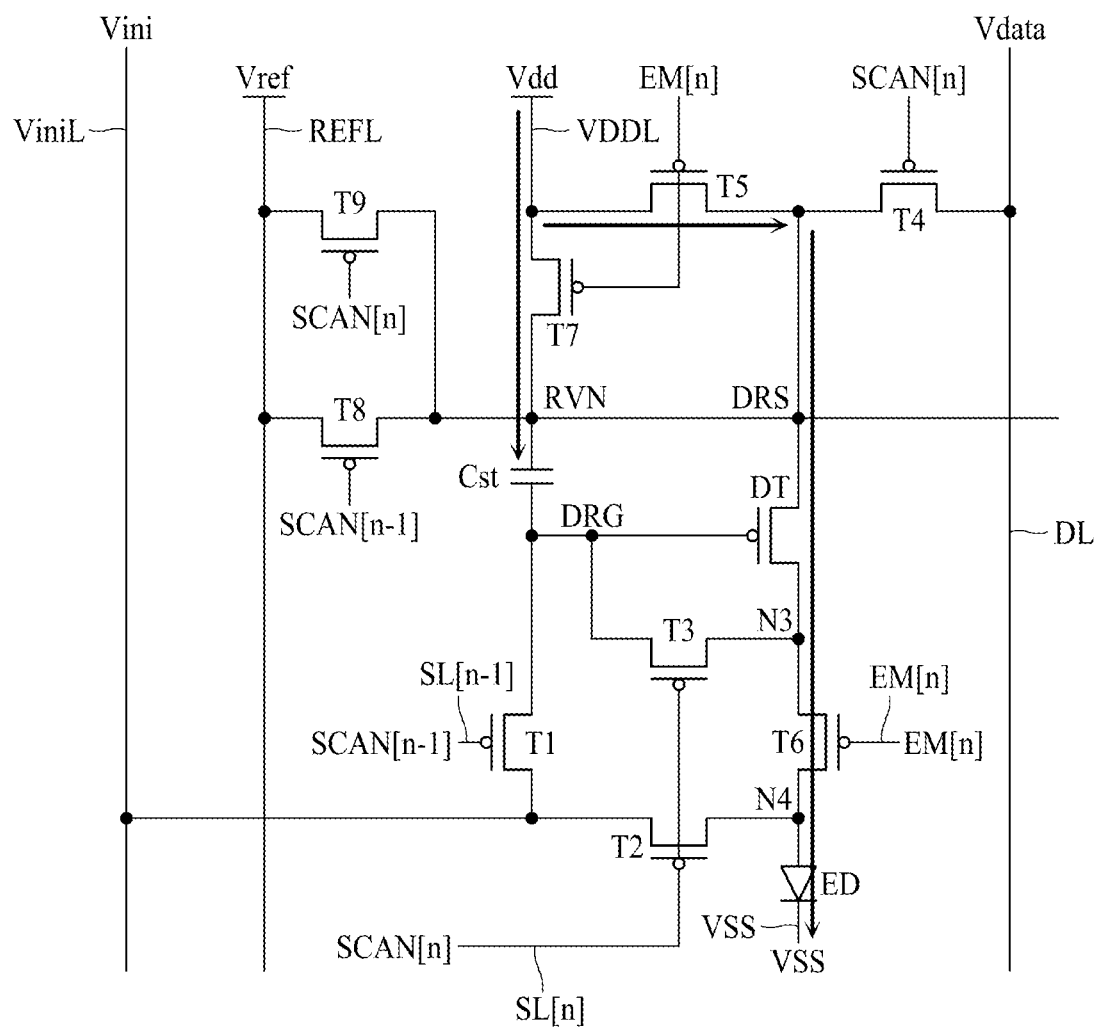
FIG. 7 is a view illustrating a signal flow at an emission period.
Figure 8:
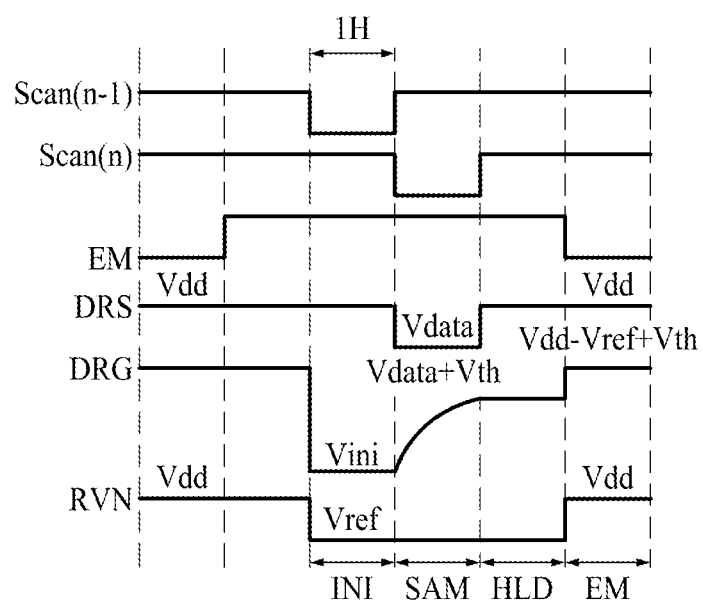
FIG. 8 is a view illustrating an example of an operation timing of the pixel circuit shown in FIG. 4.

FIG. 4 is a circuit view illustrating an example of a pixel circuit, FIG. 5 is a view illustrating a signal flow at an initialization period, FIG. 6 is a view illustrating a signal flow at a sensing period, FIG. 7 is a view illustrating a signal flow at an emission period, and FIG. 8 is a view illustrating an example of an operation timing of the pixel circuit shown in FIG. 4.

Referring to FIGS. 4 to 8, each of the subpixels P1, P2 and P3 according to one embodiment of the present disclosure may include a plurality of switching transistors T1 to T9, a driving transistor DT, a capacitor Cst, and a light emitting diode ED.

A gate electrode of the first transistor T1 may be connected to a (n−1)th scan line SL[n−1] and its first electrode may be connected to the initialization line ViniL. Also, a second electrode of the first transistor T1 may be connected to one end of the capacitor Cst, a second electrode of the third transistor T3 and a gate electrode of the driving transistor DT.

The first transistor T1 may be turned on in response to a scan signal SCAN[n−1] of a low level, which is applied through the (n−1)th scan line SL[n−1]. When the first transistor T1 is turned on, a gate node DRG of the driving transistor DT may be initialized based on an initialization voltage Vini.

A gate electrode of the second transistor T2 may be connected to a (n)th scan line SL[n] and its first electrode may be connected to an anode electrode of the light emitting diode ED. Also, a second electrode of the second transistor T2 may be connected to the initialization line ViniL.

The second transistor T2 may be turned on in response to a scan signal SCAN[n] of a low level, which is applied through the (n)th scan line SL[n]. When the second transistor T2 is turned on, the light emitting diode ED may be initialized based on the initialization voltage Vini.

A gate electrode of the third transistor T3 may be connected to the (n)th scan line SL[n] and its first electrode may be connected to a first electrode of the driving transistor DT. Also, a second electrode of the third transistor T3 may be connected to the gate electrode of the driving transistor DT.

The third transistor T3 may be turned on in response to the scan signal SCAN[n] of a low level, which is applied through the (n)th scan line SL[n]. When the third transistor T3 is turned on, the driving transistor DT may be a diode connection state.

A gate electrode of the fourth transistor T4 may be connected to the (n)th scan line SL[n] and its first electrode may be connected to a second electrode of the fifth transistor T5 and a source node DRS of the driving transistor DT. Also, a second electrode of the fourth transistor T4 may be connected to a data line DL.

The fourth transistor T4 may be turned on in response to the scan signal SCAN[n] of a low level applied through the (n)th scan line SL[n]. When the fourth transistor T4 is turned on, a data voltage Vdata applied through the data line DL may be charged in the second electrode of the fourth transistor T4.

A gate electrode of the fifth transistor T5 may be connected to a (n)th emission control line EML[n] and its first electrode may be connected to the pixel power line VDDL and a first electrode of the seventh transistor T7. Also, a second electrode of the fifth transistor T5 may be connected to the first electrode of the fourth transistor T4.

The fifth transistor T5 may be turned on in response to an emission control signal EM[n] of a low level applied through the (n)th emission control line EML[n]. When the fifth transistor T5 is turned on, the data voltage Vdata charged in the second electrode of the fourth transistor T4 may be transferred to the other end of the capacitor Cst by passing through the seventh transistor T7.

A gate electrode of the sixth transistor T6 may be connected to the (n)th emission control line EML[n] and its first electrode may be connected to the first electrode of the driving transistor DT. Also, a second electrode of the sixth transistor T6 may be connected to the anode electrode of the light emitting diode ED.

The sixth transistor T6 may be turned on in response to the emission control signal EM[n] of a low level, which is applied through the (n)th emission control line EML[n]. When the sixth transistor T6 is turned on, the light emitting diode ED may emit light in response to a driving current generated through the driving transistor DT.

A gate electrode of the seventh transistor T7 may be connected to the (n)th emission control line EML[n] and its first electrode may be connected to the pixel power line VDDL and the first electrode of the fifth transistor T5. Also, a second electrode of the seventh transistor T7 may be connected to the other end of the capacitor Cst.

The seventh transistor T7 may be turned on in response to the emission control signal EM[n] of a low level, which is applied through the (n)th emission control line EML[n]. When the seventh transistor T7 is turned on, the data voltage Vdata charged in the second electrode of the fourth transistor T4 may be transferred to the other end of the capacitor Cst after passing through the fifth transistor T5.

One end of the capacitor Cst may be connected to the second electrode of the first transistor T1, and its other end may be connected to the second electrode of the seventh transistor T7. A node provided in the second electrode of the seventh transistor T7 and at the other end of the capacitor Cst may be defined as a reference voltage transfer node RVN to which a reference voltage Vref is transferred. An anode electrode of an organic light emitting diode OLED may be connected to the second electrode of the sixth transistor T6, and its cathode electrode may be connected to a common power electrode VSS.

Meanwhile, each of the subpixels P1, P2 and P3 may further include an eighth transistor T8 and a ninth transistor T9.

A gate electrode of the eight transistor T8 may be connected to the (n−1)th scan line SL[n−1], its first electrode may be connected to a reference voltage line REFL, and its second electrode may be connected to the reference voltage transfer node RVN.

The eighth transistor T8 may be turned on in response to the scan signal SCAN[n−1] of a low level, which is applied through the (n−1)th scan line SL[n−1]. When the eighth transistor T8 is turned on, the reference voltage Vref may be transferred to the other end of the capacitor Cst.

A gate electrode of the ninth transistor T9 may be connected to the (n)th scan line SL[n], its first electrode may be connected to the reference voltage line REFL, and its second electrode may be connected to the reference voltage transfer node RVN.

The ninth transistor T9 may be turned on in response to the scan signal SCAN[n] of a low level, which is applied through the (n)th scan line SL[n]. When the ninth transistor T9 is turned on, the reference voltage Vref may be transferred to the other end of the capacitor Cst.

The subpixels P1, P2 and P3 according to one embodiment of the present disclosure may operate in the order of an initialization period INI, a sampling period SAM, a holding period HLD, and an emission period EM. The initialization period INI is a period for initializing the gate node DRG of the driving transistor DT. The sampling period SAM is a period for initializing the organic light emitting diode OLED while sampling a threshold voltage of the driving transistor DT. The holding period HLD is a period for holding the data voltage Vdata applied through the data line DL in a specific node. The emission period EM is a period for allowing the organic light emitting diode OLED to emit light based on the driving current generated in accordance with the data voltage.

The subpixels P1, P2 and P3 according to one embodiment of the present disclosure may have the initialization period INT, the sampling period SAM and the holding period HLD while the emission control signal of the low level is not being applied to the nth emission control line EML[n]. Therefore, compensation based on an internal circuit may be made in the subpixels P1, P2 and P3 according to one embodiment of the present disclosure.

The first transistor T1 may be turned on in response to the scan signal SCAN[n−1] of a low level, which is applied through the (n−1)th scan line SL[n−1] at the initialization period INI. At this time, the initialization voltage Vini may be applied to the initialization line ViniL, and the gate node DRG of the driving transistor DT may be initialized based on the initialization voltage Vini as shown in FIG. 5.

Meanwhile, the eighth transistor T8 may be turned on in response to the scan signal SCAN[n−1] of a low level, which is applied through the (n−1)th scan line SL[n−1] at the initialization period INI. At this time, the reference voltage Vref higher than the initialization voltage Vini may be applied to the reference line REFL, and may be applied to the reference voltage transfer node RVN through the eighth transistor T8 as shown in FIG. 5.

The second transistor T2, the third transistor T3 and the fourth transistor T4 may be turned on in response to the scan signal SCAN[n] of a low level, which is applied through the (n)th scan line SL[n] at the sampling period. The light emitting diode ED may be initialized based on the initialization voltage Vini by the turn-on operation of the second transistor T2. The driving transistor DT may be a diode connection state by the turn-on operation of the third transistor T3. Also, the threshold voltage of the driving transistor DT may be sampled.

The data voltage Vdata applied through the data line DL may be applied to the source node DRS of the driving transistor DT by the turn-on operation of the fourth transistor T4. The data voltage Vdata applied to the source node DRS of the driving transistor DT may be charged in the gate node DRG through the third transistor T3 as shown in FIG. 6.

Meanwhile, the ninth transistor T9 may be turned on in response to the scan signal SCAN[n] of a low level applied through the (n)th scan line SL[n] at the sampling period SAM. At this time, the reference voltage Vref higher than the initialization voltage Vini may be applied to the reference line REFL, and may be applied to the reference voltage transfer node RVN through the ninth transistor T9 as shown in FIG. 6.

The fifth transistor T5, the sixth transistor T6 and the seventh transistor T7 may be turned on in response to the emission control signal EM[n] of a low level, which is applied through the (n)th emission control line EML[n] at the emission period EM. At this time, a pixel power voltage Vdd may be applied to the pixel power line VDDL. When the fifth transistor T5 is turned on at the emission period EM, the pixel power voltage Vdd may be applied to the source node DRS of the driving transistor DT. Therefore, a data current determined based on the gate node DRG of the driving transistor DT and the pixel power voltage Vdd may be supplied to the anode electrode of the light emitting diode ED through the sixth transistor T6 which is turned on. A common power voltage Vss applied to the common power electrode VSS may be supplied to the cathode electrode of the light emitting diode ED.

When the seventh transistor T7 is turned on, the pixel power voltage Vdd applied through the pixel power line VDDL may be applied to the reference voltage transfer node RVN.

Referring to FIGS. 2 and 3, the non-display area NDA may be provided with a pad area PA in which pads PAD are disposed, and at least one scan driver 205.

In detail, the non-display area NDA may include a first non-display area NDA1 in which the pads PAD are displayed, a second non-display area NDA2 disposed in parallel with the first non-display area NDA1 with the display area DA interposed therebetween, and third and fourth non-display areas NDA3 and NDA4 connecting the first non-display area NDA1 with the second non-display area NDA2.

The scan driver 205 are connected to the scan lines SL and supplies scan signals to the scan lines SL. The scan driver 205 may be disposed in at least one of the third non-display area NDA3 and the fourth non-display area NDA4 in a gate driver in panel (GIP) type. For example, as shown in FIG. 2, the scan driver 205 may be formed in the third non-display area NDA3, and another scan driver 205 may be formed in the fourth non-display area NDA4, but these gate drivers are not limited thereto. In some embodiments, the scan driver 205 may be formed only in any one of the third non-display area NDA3 and the fourth non-display area NDA4.

The pads PAD may include a first pad VDDP, a second pad VSSP, a third pad VREFP, and a fourth pad DP, and may be provided in the first non-display area NDA1. That is, the first non-display area NDA1 may include a pad area PA.

In the transparent display panel 110 according to one embodiment of the present disclosure, a plurality of metal lines may be disposed in the non-display area NDA, particularly the first non-display area NDA1 and the second non-display area NDA2.

Each of the first non-display area NDA1 and the second non-display area NDA2 may be provided with a pixel power electrode VDD and a common power electrode VSS.

In detail, a first common power electrode VSS1 may be provided to be extended from the first non-display area NDA1 in a first direction, and may be connected with the second pad VSSP to receive a first power source from the second pad VSSP. A second common power electrode VSS2 may be provided to be extended from the second non-display area NDA2 in the first direction.

The first common power electrode VSS1 and the second common power electrode VSS2 may electrically be connected each other through a plurality of initialization lines ViniL extended from the display area DA in a second direction. The plurality of initialization lines ViniL may transfer the first power source supplied to the second pad VSSP to the second common power electrode VSS2. The first common power electrode VSS1 and the second common power electrode VSS2 may be connected to a cathode electrode 140 of the subpixels P1, P2 and P3 to supply the first power source. At this time, the first power source may be a common power source commonly supplied to the subpixels P1, P2 and P3.

The first pixel power electrode VDD1 may be provided to be extended from the first non-display area NDA1 in the first direction, and may be connected with the first pad VDDP to receive a second power source from the first pad VDDP. A second pixel power electrode VDD2 may be provided to be extended from the second non-display area NDA2 in the first direction.

The first pixel power electrode VDD1 and the second pixel power electrode VDD2 may electrically be connected each other through a plurality of pixel power lines VDDL extended from the display area DA in a second direction. The plurality of pixel power lines VDDL may supply the second power source supplied to the first pad VDDP, for example, a pixel power source to the driving transistor DT of each of the subpixels P1, P2 and P3 provided in the display area DA and at the same time transfer the pixel power source to the second pixel power electrode VDD2.

The transparent display panel 110 according to one embodiment of the present disclosure is characterized in that the first common power electrode VSS1 provided in the first non-display area NDA1 and the second common power electrode VSS2 provided in the second non-display area NDA2 are electrically connected with each other through the initialization line ViniL. Therefore, since the transparent display panel 110 according to one embodiment of the present disclosure may not be provided with a separate common power line in the display area DA, a size of the transmissive area TA may be increased.

Hereinafter, the above features will be described in detail together with the elements of the transparent display panel 110 with reference to FIGS. 9 to 12.

Figure 9:
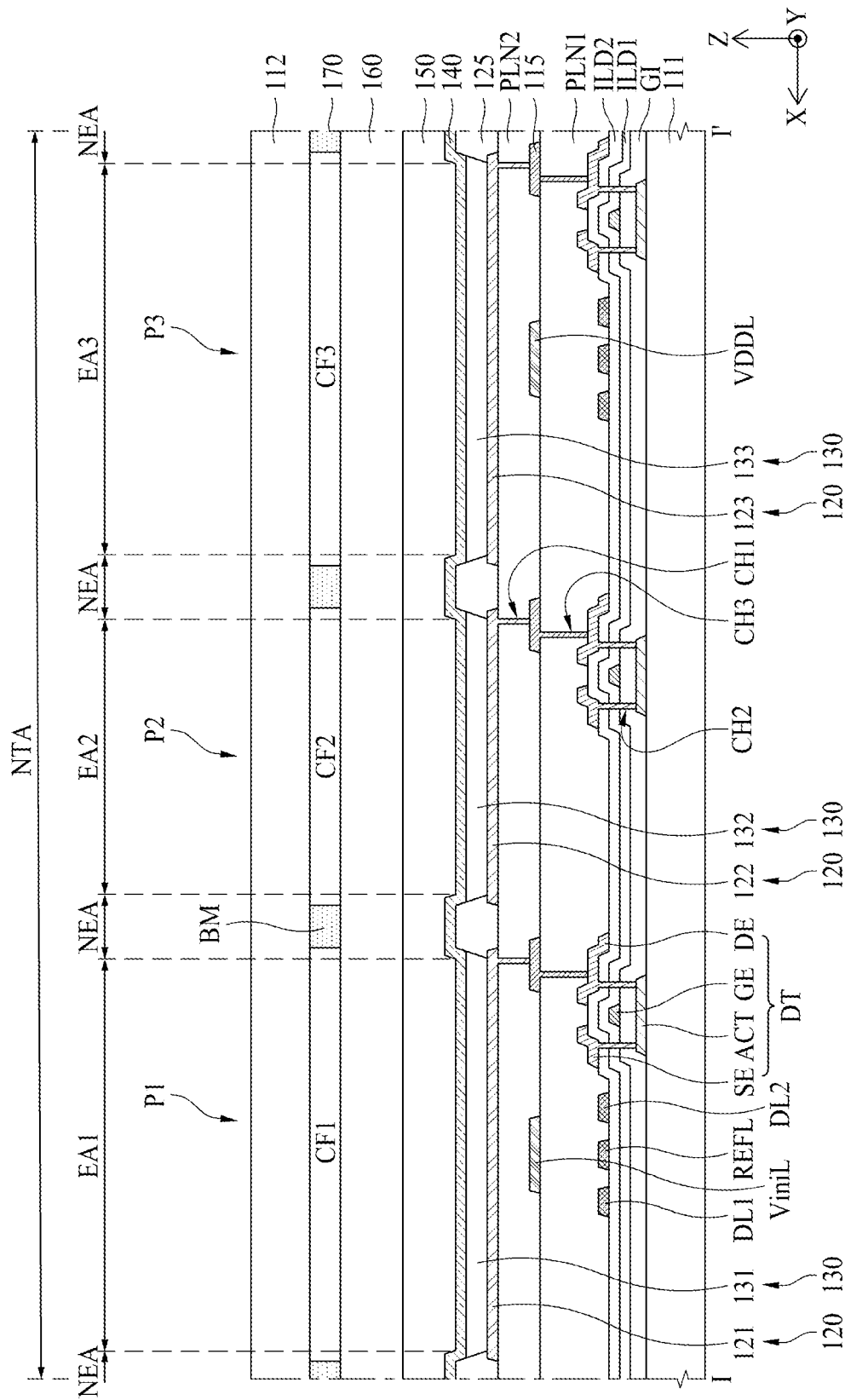
FIG. 9 is a cross-sectional view taken along line I-I' of FIG. 3.
Figure 10:
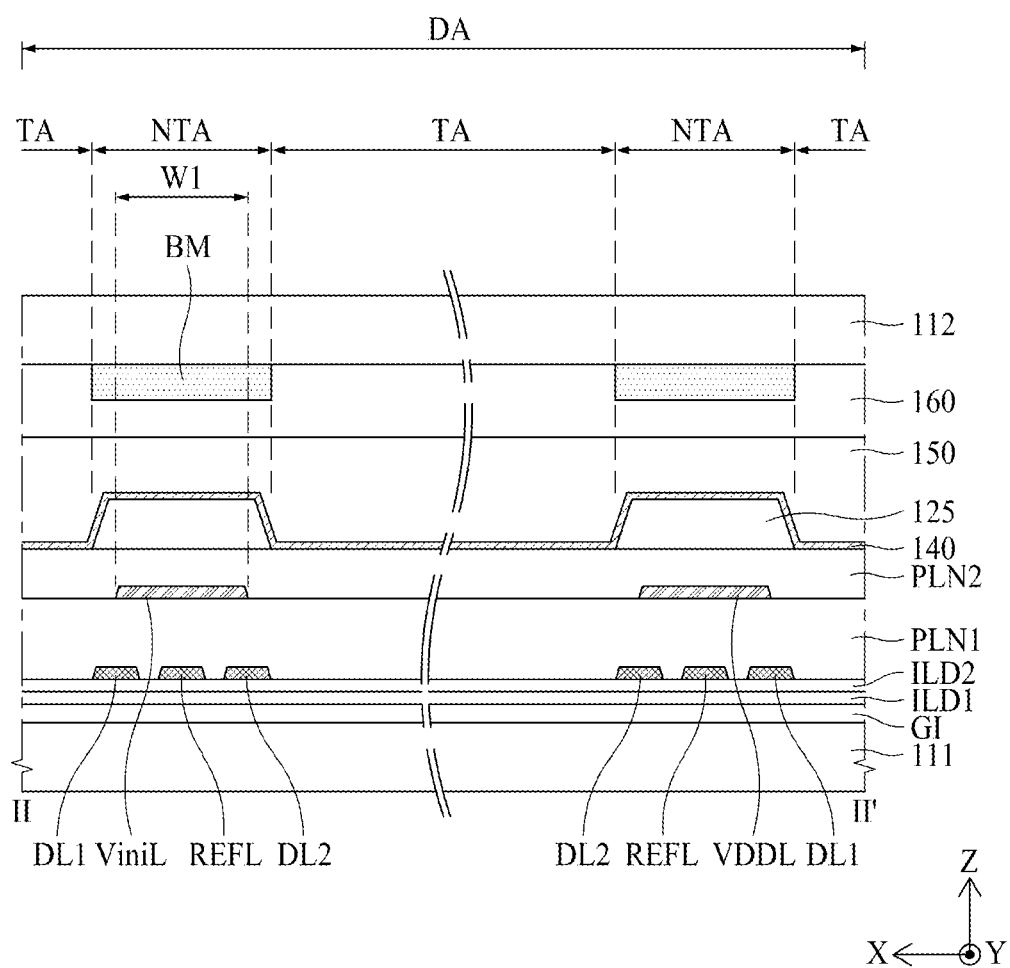
FIG. 10 is a cross-sectional view taken along line II-II' of FIG. 3.
Figure 11:
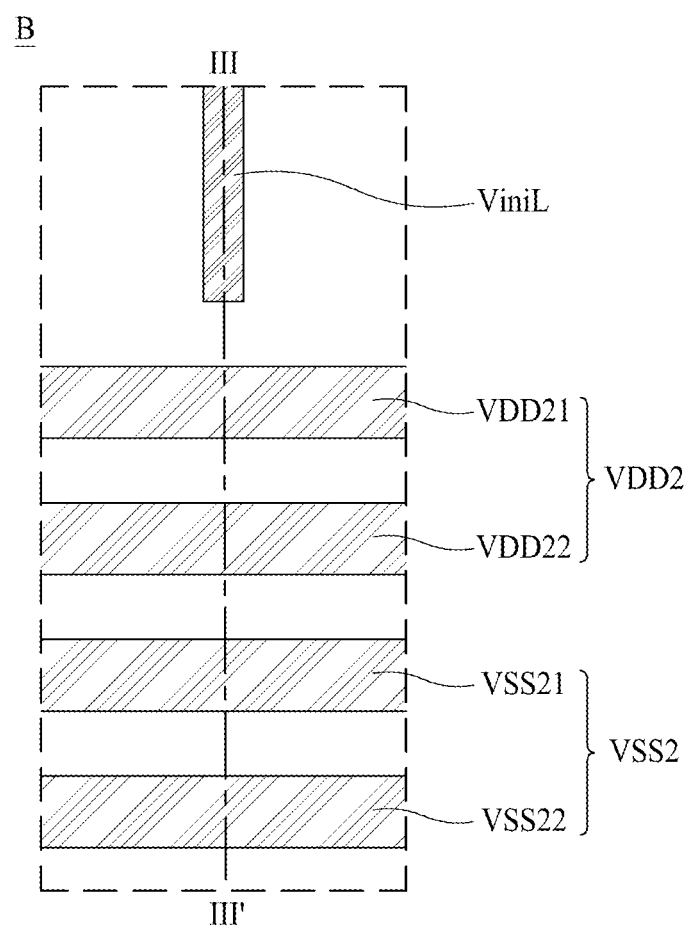
FIG. 11 is an enlarged view illustrating an area B of FIG. 2.
Figure 12:
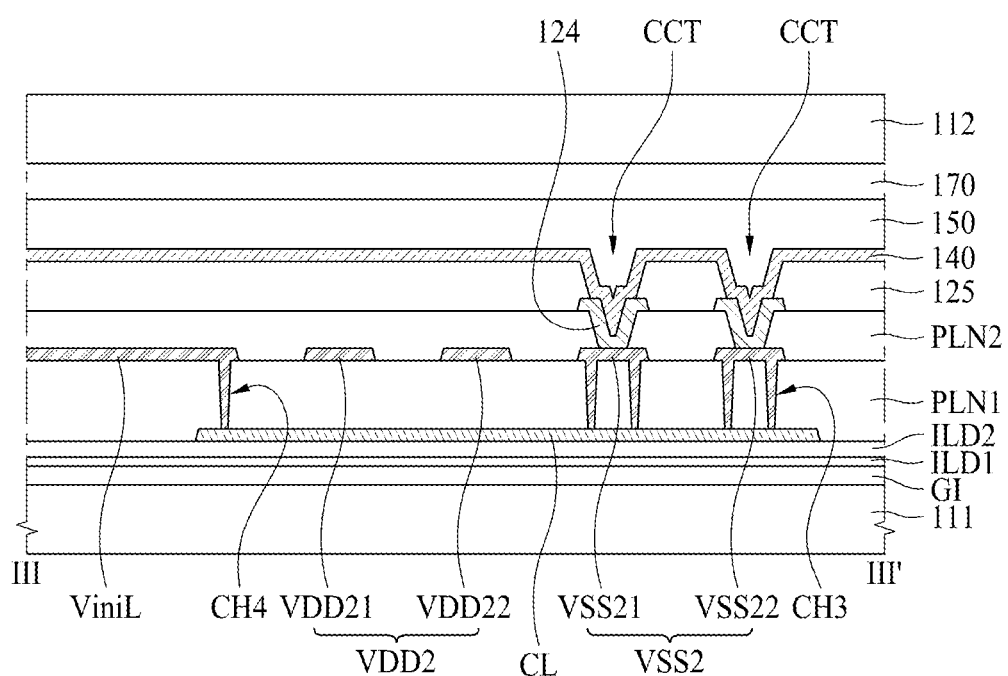
FIG. 12 is a cross-sectional view taken along line of FIG. 11.
Figure 13:
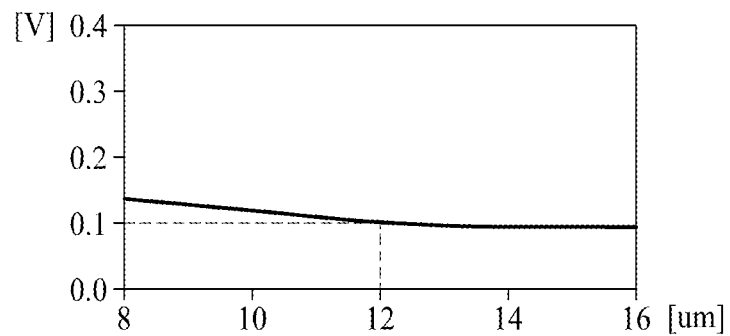
FIG. 13 is a graph illustrating a voltage deviation based on a line width.
Figure 14:
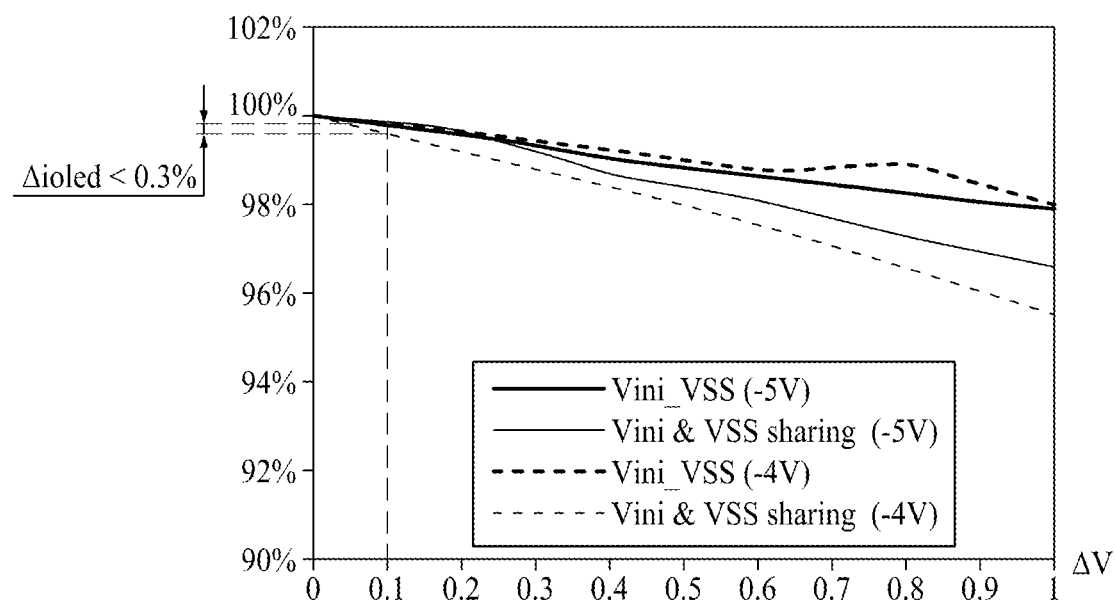
FIG. 14 is a graph illustrating a change of a current based on a voltage deviation.

FIG. 9 is a cross-sectional view taken along line I-I' of FIG. 3, FIG. 10 is a cross-sectional view taken along line II-II' of FIG. 3, and FIG. 11 is an enlarged view illustrating an area B of FIG. 2, FIG. 12 is a cross-sectional view taken along line of FIG. 11. FIG. 13 is a graph illustrating a voltage deviation based on a line width, and FIG. 14 is a graph illustrating a change of a current based on a voltage deviation.

Referring to FIG. 2, FIG. 3 and FIGS. 9 to 12, the first substrate 111 may be categorized into a display area DA provided with pixels P to display an image, and a non-display area NDA for not displaying an image.

The display area DA includes a transmissive area TA and a non-transmissive area NTA as shown in FIG. 3. The non-transmissive area NTA may be provided with pixels P comprised of a first subpixel P1, a second subpixel P2 and a third subpixel P3, and a plurality of signal lines for supplying a signal to each of the plurality of subpixels P1, P2 and P3.

A circuit element including a capacitor, a thin film transistor, etc., and a light emitting diode may be provided in each of the first subpixel P1, the second subpixel P2 and the third subpixel P3. The thin film transistor may include the plurality of transistors and the driving transistor DT as described with reference to FIGS. 4 to 8.

The driving transistor DT includes an active layer ACT, a gate electrode GE, a source electrode SE, and a drain electrode DE.

In detail, the active layer ACT may be provided over the first substrate 111. The active layer ACT may be formed of a silicon based semiconductor material or an oxide based semiconductor material. A buffer layer (not shown) may be provided between the active layer ACT and the first substrate 111.

A gate insulating layer GI may be provided over the active layer ACT. The gate insulating layer GI may be formed as an inorganic film, for example, a silicon oxide (SiOx) film, a silicon nitride (SiNx) film, or a multi-layered film of SiOx and SiNx.

A gate electrode GE may be provided over the gate insulating layer GI. The gate electrode GE may be formed of a single layer or a multi-layer made of any one of Mo, Al, Cr, Au, Ti, Ni, Nd and Cu or their alloy.

A first inter-layer insulating layer ILD1 and a second inter-layer insulating layer ILD2 may be provided over the gate electrode GE. The first inter-layer insulating layer ILD1 and the second inter-layer insulating layer ILD2 may be formed as an inorganic layer, for example, a silicon oxide (SiOx) layer, a silicon nitride (SiNx) layer, or a multi-layered layer of SiOx and SiNx.

Source and drain electrodes SE and DE may be provided over the second inter-layer insulating layer ILD2. One of the source and drain electrodes SE and DE may be connected to the active layer ACT through a second contact hole CH2 that passes through the gate insulating layer GI and the first and second inter-layer insulating layers ILD1 and ILD2.

The source and drain electrodes SE and DE may be formed of a single layer or a multi-layer made of any one of Mo, Al, Cr, Au, Ti, Ni, Nd and Cu or their alloy.

A first planarization layer PLN1 may be provided over the source and drain electrodes SE and DE to planarize a step difference caused by the driving transistor DT. The first planarization layer PLN1 may be formed of an organic layer, for example, acryl resin, epoxy resin, phenolic resin, polyamide resin, polyimide resin, etc.

An anode auxiliary electrode 115 may be provided over the first planarization layer PLN1. The anode auxiliary electrode 115 may be connected to one of the source and drain electrodes SE and DE through a third contact hole CH3 that passes through the first planarization layer PLN1. For example, the anode auxiliary electrode 115 may be connected to the drain electrode DE through the third contact hole CH3 that passes through the first planarization layer PLN1.

The anode auxiliary electrode 115 may be formed of a single layer or a multi-layer made of any one of Mo, Al, Cr, Au, Ti, Ni, Nd and Cu or their alloy.

A second planarization layer PLN2 may be formed over the anode auxiliary electrode 115. The second planarization layer PLN2 may be formed of an organic layer, for example, acryl resin, epoxy resin, phenolic resin, polyamide resin, polyimide resin, etc.

Light emitting diodes, which are comprised of the anode electrode 120, an organic light emitting layer 130, and a cathode electrode 140, and a bank 125 are provided over the second planarization layer PLN2.

An anode electrode 120 may be provided over a second planarization layer PLN2 and connected with the driving transistor DT. In detail, the anode electrode 120 may be connected to an anode auxiliary electrode 115 through a first contact hole CH1 that passes through the second planarization layer PLN2. Since the anode auxiliary electrode 115 is connected to a source electrode SE or a drain electrode DE of the driving transistor DT through a third contact hole CH3, the anode electrode 120 may electrically be connected with the driving transistor DT.

The anode electrode 120 may be provided for each of the subpixels P1, P2 and P3. The anode electrode 120 is not provided in the transmissive area TA.

The anode electrode 120 according to one embodiment of the present disclosure may include a first anode electrode 121, a second anode electrode 122 and a third anode electrode 123.

A first anode electrode 121 may be disposed over the initialization line ViniL. In detail, at least a part of the first anode electrode 121 may be disposed to overlap the first overlapping area where the initialization line ViniL and the scan line SL cross each other.

The first anode electrode 121 may be provided in a plural number over the initialization line ViniL along the initialization line ViniL. The subpixels provided with the plurality of first anode electrodes 121 may be at least one of the first subpixels P1 or the third subpixels P3. For example, the subpixels provided with the plurality of first anode electrodes 121 may be the first subpixels P1. For another example, the subpixels provided with the plurality of first anode electrodes 121 may be the third subpixels P3. For other example, the subpixels provided with the plurality of first anode electrodes 121 may be the first subpixels P1 and the third subpixels P3. At this time, the first subpixels P1 and the third subpixels P3 may alternately be disposed over the initialization line ViniL.

A third anode electrode 123 may be disposed over the pixel power line VDDL. In detail, at least a part of the third anode electrode 123 may be disposed to overlap the second overlapping area where the pixel power line VDDL and the scan line SL cross each other.

The third anode electrode 123 may be provided in a plural number over the pixel power line VDDL along the pixel power line VDDL. The subpixels provided with the plurality of third anode electrodes 123 may be at least one of the first subpixels P1 or the third subpixels P3. For example, the subpixels provided with the plurality of third anode electrodes 123 may be the first subpixels P1. For another example, the subpixels provided with the plurality of third anode electrodes 123 may be the third subpixels P3. For other example, the subpixels provided with the plurality of third anode electrodes 123 may be the first subpixels P1 and the third subpixels P3. At this time, the first subpixels P1 and the third subpixels P3 may alternately be disposed over the common power line VSSL.

A second anode electrode 122 may be disposed between the first anode electrode 121 and the third anode electrode 123. In detail, the second anode electrode 122 may be disposed over the scan line SL provided between the first overlapping area and the second overlapping area.

Each of the first anode electrode 121 and the third anode electrode 123 may have a shape different from that of the second anode electrode 122. For example, the first anode electrode 121 and the third anode electrode 123 may be formed in a polygonal shape such as a hexagonal shape or an octagonal shape, and the second anode electrode 122 may be formed in a square shape, but the anode electrodes are not limited thereto.

Meanwhile, the second anode electrode 122 may have an area smaller than that of each of the first anode electrode 121 and the third anode electrode 123. Therefore, the second subpixel P2 provided with the second anode electrode 122 may have an emission area smaller than that of the first subpixel P1 or the third subpixel P3 provided with the first anode electrode 121 or the third anode electrode 123. The second subpixel P2 may be a red subpixel emitting red light. Generally, since the red subpixel has lifespan more excellent than that of each of a green subpixel and a blue subpixel, even though the red subpixel is formed to have a small area, lifespan of the transparent display panel 110 may not be reduced.

The first anode electrode 121, the second anode electrode 122 and the third anode electrode 123 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO. The Ag alloy may be an alloy of silver (Ag), palladium (Pb), and Copper (Cu).

A bank 125 may be provided over the second planarization film PLN2. Also, the bank 125 may be provided between the anode electrodes 120. In detail, the bank 125 may be provided among the first anode electrode 121, the second anode electrode 122 and the third anode electrode 123, which are disposed to be adjacent to one another in a first direction (e.g., X-axis direction). Also, the bank 125 may be provided among the plurality of first anode electrodes 121 disposed over the initialization line ViniL in a second direction (e.g., Y-axis direction). Also, the bank 125 may be provided among the plurality of third anode electrodes 123 disposed over the pixel power line VDDL along the second direction (e.g., Y-axis direction).

The bank 125 may be formed to cover or at least partially cover an edge of each of the first anode electrode 121, the second anode electrode 122 and the third anode electrode 123 and expose some of each of the first anode electrode 121, the second anode electrode 122 and the third anode electrode 123. Therefore, the bank 125 may prevent light emission efficiency from being deteriorated due to a current concentrated on an end of each of the first anode electrode 121, the second anode electrode 122 and the third anode electrode 123.

The bank 125 may respectively define emission areas EA1, EA2, and EA3 of the subpixels P1, P2 and P3. Each of the emission areas EA1, EA2 and EA3 of the subpixels P1, P2 and P3 indicates an area where the anode electrode 120, the organic light emitting layer 130 and the cathode electrode 140 are sequentially deposited and then holes from the anode electrode 120 and electrons from the cathode electrode 140 are combined with each other in the organic light emitting layer 130 to emit light. In this case, the area where the bank 125 is not formed and the anode electrode 120 is exposed may be an emission area EA, and the other area may be a non-emission area NEA.

The bank 125 may be formed of an organic layer, for example, acryl resin, epoxy resin, phenolic resin, polyamide resin, polyimide resin, etc.

The organic light emitting layer 130 may be provided over the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

An organic light emitting layer 130 may include light emitting layers formed per subpixels P1, P2 and P3 as shown in FIG. 9. For example, a green light emitting layer 131 emitting green light may be formed in the first subpixel P1, a red light emitting layer 132 emitting red light may be formed in the second subpixel P2, and a blue light emitting layer 133 emitting blue light may be formed in the third subpixel P3. In this case, the light emitting layers of the organic light emitting layer 130 are not formed in the transmissive area TA.

The cathode electrode 140 may be provided over the organic light emitting layer 130 and the bank 125. The cathode electrode 140 may be provided in the transmissive area TA as well as the non-transmissive area NTA that includes the emission area EA, but is not limited thereto. In some embodiments, the cathode electrode 140 may be provided only in the non-transmissive area NTA that includes the emission area EA, but may not be provided in the transmissive area TA to improve transmittance.

The cathode electrode 140 may be a common layer commonly formed in the subpixels P1, P2 and P3 to apply the same voltage. The cathode electrode 140 may be formed of a conductive material that may transmit light. For example, the cathode electrode 140 may be formed of a low resistance metal material, for example, Ag, or alloy of Mg and Ag.

The cathode electrode 140 may be formed of ITO or IZO. However, since ITO or IZO has high surface resistance, voltage drop (IR drop) may occur in the cathode electrode 140. In order to prevent voltage drop from occurring, a separate cathode auxiliary electrode may be formed on the same layer as the anode electrode 120, and a cathode contact structure for connecting the cathode electrode 140 to the cathode auxiliary electrode may be formed. However, the cathode contact structure should form the cathode auxiliary electrode between the anode electrodes 120, a size of the non-transmissive area NTA may be increased. Since a spaced distance between the anode electrodes 120 is also increased, the size of the emission area EA in the non-transmissive area NTA may be reduced.

In the transparent display panel 110 according to one embodiment of the present disclosure, the cathode electrode 140 may be formed of a low resistance metal material, for example, Ag, or alloy of Mg and Ag. Since Ag or alloy of Mg and Ag has low resistance, voltage drop (e.g., IR drop; I: current, R: resistance) may not occur. In the transparent display panel 110 according to one embodiment of the present disclosure, since the cathode auxiliary electrode and the cathode contact structure are not formed in the display area DA, the size of the transmissive area TA may be increased or maximized, and the size of the emission area EA may also be increased or maximized in the non-transmissive area NTA.

Also, since Ag or alloy of Mg and Ag, which is thin, has high light transmittance, even though the cathode electrode 140 is formed in the transmissive area TA, transmittance of the transmissive area TA may not be reduced.

An encapsulation layer 150 may be provided over the light emitting diodes. The encapsulation layer 150 may be formed over the cathode electrode 140 to overlay the cathode electrode 140. The encapsulation layer 150 serves to prevent oxygen or water from being permeated into the organic light emitting layer 130 and the cathode electrode 140. Accordingly, in some embodiments, the encapsulation layer 150 may include at least one inorganic layer and at least one organic layer.

Meanwhile, although not shown in FIG. 9, a capping layer may additionally be formed between the cathode electrode 140 and the encapsulation layer 150.

A color filter layer 170 may be provided over the encapsulation layer 150. The color filter layer 170 may be provided over one surface of the second substrate 112 that faces the first substrate 111. In this case, the first substrate 111 provided with the encapsulation layer 150 and the second substrate 112 provided with the color filter layer 170 may be bonded to each other by an adhesive layer 160. At this time, the adhesive layer 160 may be an optically clear resin (OCR) layer or an optically clear adhesive (OCA) film.

The color filter layer 170 may be formed to be patterned for each of the subpixels P1, P2 and P3. In detail, the color filter layer 170 may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA3 of the third subpixel P3, and may be a blue color filter that transmits blue light.

In the transparent display panel 110 according to one embodiment of the present disclosure, a polarizer is not used, and the color filter layer 170 is formed in the second substrate 112. When the polarizer is attached to the transparent display panel 110, transmittance of the transparent display panel 110 is reduced by the polarizer. When the polarizer is not attached to the transparent display panel 110, a problem occurs in that externally incident light is reflected in the electrodes.

The transparent display panel 110 according to one embodiment of the present disclosure may prevent transmittance from being reduced as a polarizer is not attached thereto. Also, in the transparent display panel 110 according to one embodiment of the present disclosure, the color filter layer 170 may be formed in the second substrate 112 to partially absorb externally incident light, thereby preventing the incident light from being reflected in the electrodes. That is, the transparent display panel 110 according to one embodiment of the present disclosure may reduce external light reflectance without reducing transmittance.

Meanwhile, a black matrix BM may be provided among color filters CF1, CF2 and CF3. The black matrix BM may be provided among the subpixels SP1, SP2 and SP3 to prevent color mixture from occurring among the subpixels SP1, SP2 and SP3 adjacent to one another. Also, the black matrix BM may prevent externally incident light from being reflected in a plurality of lines provided among the subpixels SP1, SP2 and SP3, for example, scan lines, data lines, pixel power lines, common power lines, reference lines, etc.

The black matrix BM may include a material that absorbs light, for example, a black dye that fully absorbs light of a visible light wavelength range.

The color filter layer 170 may define the non-transmissive area NTA in the display area DA. In detail, an area provided with the color filters CF1, CF2 and CF3 and the black matrix BM may become the non-transmissive area NTA, and the other area may become the transmissive area TA.

Meanwhile, in addition to the circuit element and the light emitting diode, a plurality of signal lines for supplying a signal to each of the plurality of subpixels P1, P2 and P3 may be provided in the non-transmissive area NTA of the display area DA. The plurality of signal lines according to one embodiment may include pixel power lines VDDL, initialization lines ViniL, reference lines REFL, data lines DL1 and DL2, and scan lines SL.

The scan lines SL may be extended from the display area DA in a first direction (e.g., X-axis direction), and may cross the pixel power lines VDDL, the initialization lines ViniL, the reference lines REFL and the data lines DL1 and DL2.

The pixel power lines VDDL, the initialization lines ViniL, the reference lines and the data lines DL1 and DL2 may be extended from the display area DA in a second direction (e.g., Y-axis direction).

At this time, the pixel power lines VDDL and the initialization lines ViniL may be disposed to be spaced apart from each other on the same layer as shown in FIGS. 9 and 10. In one embodiment, the pixel power lines VDDL and the initialization lines ViniL may be provided on the same layer as the anode auxiliary electrode 115.

The pixel power lines VDDL and the initialization lines ViniL may alternately be disposed with the transmissive area TA interposed therebetween. Therefore, one transmissive area TA may be surrounded by the pixel power line VDDL, the initialization line ViniL and two adjacent scan lines SL.

Although FIGS. 9 and 10 show that the pixel power line VDDL of the pixel power line VDDL and the initialization line ViniL is only disposed between two adjacent transmissive areas TA or the initialization line ViniL is only disposed, the present disclosure is not limited thereto.

In another embodiment, both the pixel power lines VDDL and the initialization line ViniL may be disposed between two adjacent transmissive areas TA.

One end of each of the initialization lines ViniL disposed as described above may electrically be connected to the first common power electrode VSS1 disposed in the first non-display area NDA1, and its other end may electrically be connected to the second common power electrode VSS2 disposed in the second non-display area NDA2.

At this time, the initialization lines ViniL, the first common power electrode VSS1 and the second common power electrode VSS2 may be provided on the same layer.

In one embodiment, each of the initialization lines ViniL may be formed in a single body with the first common power electrode VSS1. That is, each of the initialization lines ViniL may be formed to be diverged from one side of the first common power electrode VSS1 and extended to the display area DA.

In one embodiment, as shown in FIGS. 11 and 12, each of the initialization lines ViniL may be disposed to be spaced apart from the second common power electrode VSS2 and electrically connected with the second common power electrode VSS2 through a connection line CL. The second common power electrode VSS2 may be connected to one end of the connection line CL through a third contact hole CH3. The initialization line ViniL may be connected to the other end of the connection line CL through a fourth contact hole CH4.

At this time, the second common power electrode VSS2 may be provided in a plural number. For example, the number of the second common power electrodes VSS2 may be two as shown in FIGS. 11 and 12, but is not limited thereto. One second common power line VSS21 may be disposed to be spaced apart from the other one second common power line VS S22. In this case, each of the plurality of second common power lines VSS21 and VSS22 may be connected to the connection line CL through a plurality of third contact holes CH3, and thus may be connected to the connection line CL more stably.

Meanwhile, each of the second common power electrodes VSS2 may electrically be connected with the cathode electrode 140 through a cathode contact portion CCT. Accordingly, in some embodiments, a connection electrode 124 for connecting the second common power electrode VSS2 with the cathode electrode 140 may further be provided over the second common power electrodes VS S2. At least a part of the connection electrode 124 may be overlapped with the second common power electrodes VSS2, and may directly adjoin an upper surface of the second common power electrode VSS2.

The cathode contact portion CCT may partially expose an upper surface of the connection electrode 124, from which the bank 125 is partially removed, and which adjoins the second common power electrode VS S2. The cathode contact portion CCT may longitudinally expose the upper surface of the connection electrode 124 along the first direction (e.g., X-axis direction). As a result, the connection electrode 124 may have a wide contact area with the cathode electrode 140, and thus may stably be connected to the cathode electrode 140.

The initialization lines ViniL according to one embodiment of the present disclosure may selectively supply the initialization voltage Vini or the first power voltage Vss in accordance with an operating period. In detail, the first transistor T1 may be turned on at the initialization period INI as shown in FIG. 5, and thus the initialization lines ViniL may supply the initialization voltage Vini to the driving transistor DT of each of the subpixels P1, P2 and P3.

The second transistor T2 may be turned on at the sampling period SAM as shown in FIG. 6, and thus the initialization lines ViniL may supply the initialization voltage Vini to the light emitting diode ED.

Meanwhile, the first transistor T1 and the second transistor T2 may be turned off at the emission period EM. Therefore, the initialization lines ViniL are not connected with the driving transistor DT and the light emitting diode ED, whereby the initialization lines ViniL transfer the first power voltage Vss applied from the first common power electrode VSS1 to the second common power electrode VSS2. The second common power electrode VSS2 may supply the first power voltage Vss to the cathode electrode 140 through the cathode contact portion CCT.

In the transparent display panel 110 according to one embodiment of the present disclosure, the initialization voltage Vini applied to the initialization line ViniL and the first power voltage Vss may have the same voltage value. That is, the initialization voltage Vini and the first power voltage Vss may be equal to each other.

Generally, the initialization voltage Vini has the smallest difference from the first power voltage Vss among the first power voltage Vss, the second power voltage Vdd, the data voltage Vdata and the reference voltage Vref, and has a range similar to that of the first power voltage Vss. Therefore, even though the initialization voltage Vini and the first power voltage Vss have the same voltage value, a problem does not occur in operation of the pixel circuit.

However, the initialization line ViniL according to one embodiment of the present disclosure is connected to the first common power electrode VSS1 provided in the first non-display area NDA1 and the second common power electrode VSS2 provided in the second non-display area NDA2 unlike the related art, voltage drop may be increased in a direction from the first common power electrode VSS1 to the second common power electrode VSS2.

Therefore, when voltage drop of the initialization voltage Vini is increased, it is beneficial to consider an influence on a current flowing in the light emitting diode ED.

Referring to FIG. 13, it is noted that voltage deviation based on voltage drop is reduced in accordance with increase of a width of a signal line. For example, when the width of the signal line is 12 um, the voltage deviation may be 0.1V, approximately. When the width of the signal line is smaller than 12 um, the voltage deviation may be greater than 1V. When the width of the signal line is greater than 12 um, the voltage deviation may be smaller than 0.1V.

Referring to FIG. 14, it is noted that a current ioled flowing in the light emitting diode is reduced as the voltage deviation is increased.

In a first embodiment Vini_VS in which an initialization voltage is applied to an initialization line and a first power voltage is applied to a separate common voltage line, a decrease ratio of a current ioled flowing in the light emitting diode based on the voltage deviation is smaller than that of a second embodiment Vini&VSS in which an initialization voltage and a first power voltage are applied to an initialization line.

That is, in the second embodiment Vini&VSS in which the initialization voltage and the first power voltage are applied to the initialization line, a range of fluctuation of the current ioled flowing in the light emitting diode may be great. However, when the voltage deviation is 0.1V or less, a difference between the first embodiment and the second embodiment with respect to the range of fluctuation of the current ioled flowing in the light emitting diode is less than 0.3%. Therefore, a luminance difference between the first embodiment and the second embodiment may not be great.

When the voltage deviation is greater than 0.1V, the difference between the first embodiment and the second embodiment with respect to the range of fluctuation of the current ioled flowing in the light emitting diode may be increased to 1% or more. Therefore, a luminance difference between the first embodiment and the second embodiment may be increased.

In the transparent display panel 110 according to one embodiment of the present disclosure, the voltage deviation based on the voltage drop in the initialization line ViniL may be 0.1V or less. Accordingly, in some embodiments, the initialization line ViniL may have a width W1 of 12 um or more, which is wider than the other signal lines. Therefore, in the transparent display panel 110 according to one embodiment of the present disclosure, even though the initialization line ViniL is connected to the first common power electrode VSS1 and the second common power electrode VSS2, the range of fluctuation of the current ioled flowing in the light emitting diode is not great, whereby the luminance difference may be reduced or minimized.

Also, in the transparent display panel 110 according to one embodiment of the present disclosure, the first common power electrode VSS1 provided in the first non-display area NDA1 and the second common power electrode VSS2 provided in the second non-display area NDA2 may electrically be connected with each other using the initialization line ViniL, whereby the common power electrode may not be provided in the third non-display area NDA3 and the fourth non-display area NDA4. The transparent display panel 110 according to one embodiment of the present disclosure may reduce or minimize a luminance deviation caused by voltage drop (IR drop), and at the same time may improve transmittance in the third non-display area NDA3 and the fourth non-display area NDA4.

Also, the transparent display panel 110 according to one embodiment of the present disclosure is not provided with a separate common power line for connecting the first common power electrode VSS1 with the second common power electrode VSS2, whereby the width of the non-transmissive area NTA in the display area DA may be reduced.

When the separate common power line is provided, the common power line, the initialization line ViniL, the reference lines REFL and the data lines DL1 and DL2 should be provided between two adjacent transmissive areas TA. The common power line, the initialization line ViniL, the reference lines REFL and the data lines DL1 and DL2 are disposed to be spaced apart from one another in the non-transmissive area NTA. At this time, the non-transmissive area NTA has a limitation in reducing an area size due to a line width and a spaced distance of each of the common power line, the initialization line ViniL, the reference lines REFL and the data lines DL1 and DL2. Meanwhile, the common power line may reduce a voltage deviation caused by voltage drop as its width is increased. However, since light transmittance is reduced, there is a limitation in increasing the width of the common power line.

As the transparent display panel 110 according to one embodiment of the present disclosure is not provided with a separate common power line, the size of the non-transmissive area NTA may be reduced. Also, in the transparent display panel 110 according to one embodiment of the present disclosure, the width W1 of the initialization line ViniL for connecting the first common power electrode VSS1 with the second common power electrode VSS2 may be increased, whereby the voltage deviation caused by the voltage drop may be reduced. That is, as the number of signal lines disposed in the non-transmissive area NTA is reduced, a degree of freedom in design of a line width for the initialization line ViniL and the pixel voltage line VDDL may be ensured.

Meanwhile, one end of each of the pixel power lines VDDL may electrically be connected to the first pixel power electrode VDD1 disposed in the first non-display area NDA1 and its other end may electrically be connected with the second pixel power electrode VDD2 disposed in the second non-display area NDA2.

The pixel power lines VDDL may supply the second power voltage applied from the first pixel power electrode VDD1 to the driving transistor DT of each of the subpixels P1, P2 and P3 provided in the display area DA and at the same time transfer the second power voltage to the second pixel power electrode VDD2.

The reference lines REFL and the data lines DL1 and DL2 may be disposed to be spaced apart from each other on the same layer as shown in FIGS. 9 and 10. In one embodiment, the reference lines REFL and the data lines DL1 and DL2 may be provided on the same layer as the source electrode SE and the drain electrode DE of the driving transistor DT.

The reference line REFL and the plurality of data lines DL1 and DL2 may be provided between two adjacent transmissive areas TA. At least a part of the reference line REFL may be disposed between the first data line DL1 and the second data line DL2, and may be overlapped with the initialization line ViniL.

In the transparent display panel 110 according to one embodiment of the present disclosure, the initialization line ViniL and the pixel voltage line VDDL may be displayed over a first layer, and the reference lines REFL and the data lines DL1 and DL2 may be disposed over a second layer. In this way, in the transparent display panel 110 according to one embodiment of the present disclosure, the plurality of signal lines are divisionally disposed over a plurality of layers, whereby the size of the non-transmissive area NTA may be reduced or minimized. Therefore, the transparent display panel 110 according to one embodiment of the present disclosure may improve light transmittance.

According to the present disclosure, the following advantageous effects may be obtained.

According to the present disclosure, the first common power electrode provided in the first non-display area and the second common power electrode provided in the second non-display area may electrically be connected with each other using the initialization line, whereby a separate common power line may not be provided. Therefore, the number of signal lines disposed in the non-transmissive area may be reduced, and the degree of freedom in design of a line width for the initialization line and the pixel voltage line may be ensured. That is, the line width for the initialization line and the pixel voltage line may be increased, whereby the voltage deviation caused by voltage drop may be reduced.

Also, since the common power electrode may not be provided in the third non-display area and the fourth non-display area, transmittance in the third non-display area and the fourth non-display area may be improved.

Also, the plurality of signal lines are divisionally disposed over a plurality of layers, whereby the size of the non-transmissive area may be reduced or minimized. Therefore, light transmittance may be improved.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device comprising:
   a substrate provided with a display area on which a plurality of subpixels is disposed, a first non-display area disposed at a first side of the display area and a second non-display area disposed at a second side facing the first side;
   a first common power electrode extended in a first direction in the first non-display area;
   a second common power electrode extended in the first direction in the second non-display area, the second common power electrode opposite and facing the first common power electrode;
   an initialization line extended from the first non-display area to the second non-display in a second direction transverse to the first direction, the initialization line spaced apart from the second common power electrode from a plan view, the initialization line electrically coupling the first common power electrode with the second common power electrode and supplying an initialization voltage to each of the plurality of subpixels;
   a connection line of which one end is coupled with the second common power electrode and the other end is coupled with the initialization line;
   a first pixel power electrode disposed parallel to the first common power electrode in the first non-display area;
   a second pixel power electrode disposed parallel to the second common power electrode in the second non-display area; and
   a pixel power line electrically coupled to the first pixel power electrode and the second pixel power electrode, the pixel power line overlapping the first common power electrode in the first non-display area;
   wherein the second pixel power electrode is disposed on the same layer as the second common power electrode or the initialization line.

2. The transparent display device of claim 1, wherein the initialization line applies an initialization voltage at an initialization period, and applies a first power voltage at an emission period.

3. The transparent display device of claim 2, wherein the initialization voltage and the first power voltage have substantially the same voltage value.

4. The transparent display device of claim 1, wherein the initialization line supplies an initialization voltage to a driving transistor of each of the plurality of subpixels at an initialization period.

5. The transparent display device of claim 1, wherein the initialization line transfers a first power voltage applied from the first common power electrode to the second common power electrode at an emission period.

6. The transparent display device of claim 1,
wherein the pixel power line extended from the display area in the second direction supplies a second power voltage to each of the plurality of subpixels, and
wherein the display area includes a non-transmissive area provided with the initialization line and the pixel power line and a transmissive area provided between the initialization line and the pixel power line.

7. The transparent display device of claim 6, wherein each of the initialization line and the pixel power line is provided in a plural number, and the plurality of initialization lines and the plurality of pixel power lines are alternately disposed.

8. The transparent display device of claim 1, further comprising:
a driving transistor comprised of an active layer, a gate electrode, a source electrode, and a drain electrode;
a first planarization layer provided over the driving transistor;
an anode auxiliary electrode provided over the first planarization layer;
a second planarization layer provided over the anode auxiliary electrode; and
a light emitting diode provided over the second planarization layer,
wherein the initialization line is provided on the same layer as the anode auxiliary electrode.

9. The transparent display device of claim 8, further comprising a plurality of signal lines extended from the same layer as the source electrode and the drain electrode in the second direction.

10. The transparent display device of claim 1,
wherein the initialization line has a width wider than a width of each of the plurality of signal lines.

11. The transparent display device of claim 1, wherein one end of the initialization line is coupled with the first common power electrode.

12. The transparent display device of claim 1, wherein the initialization line and the second common power electrode are disposed to be spaced apart from each other on the same layer.

13. The transparent display device of claim 1, wherein the initialization line and the second common power electrode are disposed on a same layer, and wherein the connection line is disposed on a different layer than the initialization line and the second common power electrode.

14. The transparent display device of claim 1,
wherein the pixel power line overlaps at least one of a data line and a reference line.

15. The transparent display device of claim 14, further comprising:
a bank defining emission areas of the subpixels; and
a cathode electrode electrically connected with the second pixel power electrode, the cathode electrode provided over the bank,
wherein the bank and the cathode electrode overlap with the pixel power line.

16. The transparent display device of claim 14, further comprising:

a black matrix defining a non-transmissive area included in display area, and
wherein the black matrix overlaps with the pixel power line.

17. A transparent display device comprising:
a substrate having thereon a display area configured to display images and a non-display area for not displaying images, the display area provided with a plurality of subpixels, the display area including a transmissive area and a non-transmissive area, the transmissive area configured to transmit external light;
a first signal line disposed in the non-transmissive area, receiving an initialization voltage applied at an initialization period and receiving a first power voltage applied at an emission period;
a second signal line disposed in the non-transmissive area, receiving a reference voltage applied at the initialization period; and
a third signal line disposed to be spaced apart from the first signal line with the transmissive area interposed therebetween, receiving a second power voltage applied at the emission period,
wherein the first signal line is on a first layer and the third signal line is on the same first layer, and the second signal line is on a second layer different from the first layer, and
wherein the initialization voltage and the first power voltage have the same voltage value.

18. The transparent display device of claim 17, wherein at least a part of the second signal line is overlapped with the first signal line or the third signal line.

19. The transparent display device of claim 17, wherein the first signal line supplies the initialization voltage to a driving transistor of each of the plurality of subpixels at the initialization period.

20. The transparent display device of claim 17, further comprising:
a driving transistor comprised of an active layer, a gate electrode, a source electrode, and a drain electrode;
a first planarization layer provided over the driving transistor;
an anode auxiliary electrode provided over the first planarization layer; and
a second planarization layer provided over the anode auxiliary electrode,
wherein the first layer is a layer provided with the anode auxiliary electrode, and the second layer is a layer provided with the source electrode and the drain electrode.

21. A transparent display device comprising:
a substrate having thereon a display area configured to display images and a non-display area for not displaying images, the display area provided with a plurality of subpixels, the display area including a transmissive area and a non-transmissive area, the transmissive area configured to transmit external light;
a first signal line disposed in the non-transmissive area, receiving an initialization voltage applied at an initialization period and receiving a first power voltage applied at an emission period;
a second signal line disposed in the non-transmissive area, receiving a reference voltage applied at the initialization period; and
a third signal line disposed to be spaced apart from the first signal line with the transmissive area interposed therebetween, receiving a second power voltage applied at the emission period, wherein the first signal line is on a first layer and the third signal line is on the same first layer, and the second signal line is on a second layer different from the first layer, and wherein the first signal line has a width wider than that of the second signal line.

22. The transparent display device of claim 21, wherein the first signal line overlaps with the second signal line from a plan view.

* * * * *